(12) United States Patent
Thompson

(10) Patent No.: US 6,361,921 B1
(45) Date of Patent: *Mar. 26, 2002

(54) PRIMING COMPOSITION FOR BONDING PHOTORESISTS ON SUBSTRATES

(76) Inventor: Andrew Michael Thompson, 409 Mercer St., Ridgway, PA (US) 14853

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/189,856

(22) Filed: Nov. 12, 1998

(51) Int. Cl.[7] .................................. G03C 1/76
(52) U.S. Cl. ..................... 430/270.1; 430/271.1; 525/540; 528/424
(58) Field of Search ............... 525/540; 528/424; 430/270.1, 271.1

(56) References Cited

U.S. PATENT DOCUMENTS

| | | | |
|---|---|---|---|
| 3,692,092 A | 9/1972 | Longoria | 162/164 |
| 3,867,175 A | 2/1975 | Dornte | 117/47 |
| 4,060,656 A | 11/1977 | Naka et al. | 428/355 |
| 4,272,601 A | * 6/1981 | Tokura et al. | 430/108 |
| 4,483,913 A | 11/1984 | Eklund et al. | 430/160 |
| 4,559,288 A | * 12/1985 | Nakao et al. | 430/60 |
| 4,579,801 A | * 4/1986 | Yashiki | 430/60 |
| 4,797,187 A | 1/1989 | Davis et al. | 204/181 |
| 6,121,218 A | * 9/2000 | Thompson | 510/176 |

FOREIGN PATENT DOCUMENTS

WO  WO 98/01208  1/1998

OTHER PUBLICATIONS

Miall, L. Mackenzie., Sharp, D.W.A., A New Dictionary of Chemistry, 4th Edition. Longman, pp. 100 & 229.*
Patent Abstracts of Japan, vol. 012, No. 431, date Jul. 7, 1988.

* cited by examiner

Primary Examiner—Hoa Van Le
Assistant Examiner—Barbara Gilmore
(74) Attorney, Agent, or Firm—Pillsbury Winthrop LLP

(57) ABSTRACT

A priming concentrate composition is provided that may be deposited on a substrate and functions as an adhesion promoting composition for bonding a subsequently applied photoresist to the substrate. The composition contains, as an essential constituent, a polyelectrolyte having substituents derived from cyclic ethers, preferably epichlorohydrin and/or ethylene oxide. The priming composition can be applied to a stationary or moving substrate, as a concentrate or further diluted with an aqueous medium, by brushing, spraying or immersing and the like.

30 Claims, 1 Drawing Sheet

PRIMING COMPOSITION FOR BONDING PHOTORESISTS ON SUBSTRATES

The complete disclosure of U.S. patent application Ser. No. 08/968,304 filed Nov. 12, 1997 is incorporated herein by reference.

BACKGROUND OF THE INVENTION

1. Field of the Invention

This invention relates to priming compositions for use in cleaning substrates and promoting adhesion between photoresists and various metallic and non-metallic substrates. This invention further relates to articles manufactured with the priming compositions, and to methods of treating substrates and bonding photoresists to the treated substrates.

2. Description of the Related Art

The coating of substrates with positive-type photoresist (photochemical degradation) or negative-type photoresist (photochemical crosslinking) for the purpose of recording positive or negative information through photolithography is known. This technique is practiced in the manufacture of, for example, semiconductors, optical media (e.g., compact discs), holography, and other related microelectronic components. It is also known in this industry to use primers to treat the substrates in an effort to improve adhesion between a subsequently applied layer of photoresist and the substrate. Improvement in adhesion is performed with the intention of providing advantageous properties, such as prevention of delamination and undercutting, as well as the significant reduction, if not elimination, of adhesion failure caused by the generation of nitrogen gas during exposure of the photoresist (a phenomena generally known as popping). In the field of optical media, such as CD's and DVD's, primers desirably reduce jitter and improved block error rate.

Current photoresist adhesion promoters include silanes, of which hexamethyldisilane ("HMDS") is most common. Other common priming agents include, but are not limited to, titanates, $SnCl_2$, and various silane ($Si_nH_{2n+2}$) compounds. HMDS is believed to form a bridge bond, or crosslinking, between the photoresist and the substrate, thereby improving adhesion. However, HMDS has several drawbacks that deprecate this advantage. For example, HMDS is insufficiently tolerant to water so that the presence of moisture between the substrate and HMDS may result in adhesion failure. As a consequence, additional processing steps, such as baking, often require complete drying of the substrates prior to the application of HMDS. Additionally, the formation of covalent bonds or crosslinking between the HMDS and both the substrate and photoresist significantly increases reconditioning requirements of substrate recycling. Mechanical etching is usually required to completely remove these conventional primers. Furthermore, silanes require the presence of reactive hydroxyl groups on the surface of the substrate to form covalent bonds. Silanes are therefore ineffective at priming many substrates, especially metal substrates on which hydroxyl groups are not available for bonding. Yet another drawback of silanes and titanates is that they tend to be hazardous materials, posing health and safety hazards and increasing costs associated with their use.

Sensitizing agents, such as stannous chloride, may be used on certain substrates, for example, glass, to roughen the surface to improve adhesion. However, any physical modification to the substrate is considered undesirable in almost all microlithography applications.

It would therefore be a significant advancement in the art to provide an improved priming composition that is non-hazardous and functions both as an effective cleaner and adhesion promoter so as to eliminate the need for separate wet process cleaning and priming of substrates prior to photoresist application, yet is sufficiently versatile to permit it to be used for priming metallic or non-metallic substrates to be adhered to positive photoresist or negative photoresist.

SUMMARY OF THE INVENTION

It is, therefore, an object of this invention to achieve the above-discussed advancement in the art by the provision of an improved primer composition that is non-hazardous, yet sufficiently versatile to bond metallic and non-metallic substrates to a positive or negative photoresist.

In accordance with the principles of this invention, these and other objects are achieved by the provision of a priming composition which may be coated on a substrate and is capable of creating covalent bonds with both the substrate and a subsequently applied photoresist to thereby link the substrate to the photoresist.

In accordance with an embodiment of this invention, the priming composition comprises at least one water-soluble polymer having a plurality of substituents derived from cyclic ethers. The backbone of the polymer may be formed, by way of example and without limitation, from tertiary amines or quaternary ammonium compounds. The backbone may be derived from one or more compounds containing cyclic nitrogen-containing rings, such as aziridines and imidazoles. In cases in which one of these representative backbones is selected, the cyclic ethers are grafted onto nitrogen atoms of the backbone. The cyclic ether is preferably an epoxide, such as ethylene oxide and/or epichlorohydrin. Representative polymers include hydroxyethylated polyethylene imine and polyethylene imine epichlorohydrin.

Because the polyelectrolyte is water soluble, it allows for greater versatility with respect to ingredients that may be included in the priming composition. The priming composition optionally may include one or more of the following, in any combination: at least one alcohol capable of increasing the stability and wetting properties of the priming composition; at least one member selected from the group consisting of alcohol ethers and ether acetates; at least one non-ionic surfactant; and/or at least one detergency enhancing agent. The pH of the priming composition may be modified to provide optimum performance through the addition of an organic acid. For example, for polyethylene imine—epichlorohydrin, the pH is preferably between about 3.5 and about 7.

Some materials may be incompatible with certain embodiments of this invention and generally should be avoided. These materials include the following: mercaptans; strong oxidizing or reducing agents (although such agents may be added in diluted form); dextran sulfates and other sulfates or phosphate compounds that may be bound to any free amines. With regard to phosphate and sulfate compounds, these compounds may provide some benefit when added in a polyprotic acid form so as to act as counter ions to the polyelectrolyte. Other incompatible materials include ionic constituents, such as anionic wetting agents which may reactive with the ether rings and interfere with the charge density site on which the cyclic ether is grafted.

Another object of the invention is to provide microelectronic components having improved physical and performance properties comprising a photoresist bonded to a substrate with the inventive priming composition.

In accordance with the principles of this invention, these and other objects are attained by the provision of microelectronic components comprising: a substrate, such as silicon, glass, indium tin oxide, gallium arsenate, nickel, and the like; an effective amount of a film of the priming composition of the invention carried on and bonded to at least one surface of the substrate; and a layer of a negative or positive photoresist bonded to the substrate by the priming composition described above.

A further object is to provide an economical method of applying the embodiments of the inventive priming composition to a substrate prior to coating with a photoresist in a more flexible and efficient manner than presently known.

In accordance with the principles of this invention, these and other objects are attained by the provision of a method of cleaning or cleansing at least one surface of a substrate and bonding of a photoresist layer subsequently applied to the cleaned surface. This method generally comprises: washing at least one surface of a substrate (e.g., silicon, glass, indium tin oxide, nickel, and gallium arsenate) with an effective amount of the priming composition of the invention sufficient to bind the polyelectrolyte to the substrate via covalent bonds formed by first oxygen atoms of the cyclic ethers; optionally rinsing the washed surface with an aqueous solution sufficient to remove contaminants and leave a thin film of priming composition on the cleaned surface; applying a layer of photoresist to the cleaned surface; and curing the layer of photoresist under conditions which cause the film of priming composition to form covalent bonds with the photoresist via second (residual) oxygen atoms of the cyclic ethers and thereby link the substrate to the photoresist.

Still a further object is to provide an economical method of applying the inventive priming composition to the substrate at the same time the photoresist is applied to the substrate to provide an even more flexible and efficient manner than presently known.

In accordance with the principles of this invention, these and other objects are achieved by premixing the inventive priming composition with a photoresist precursor composition to form a pre-primed photoresist composition. In this variant embodiment, the priming composition by pre-dissolved in a solvent compatible with the photoresist. This variation allows for the elimination of separate priming and photoresist coating steps.

These and other objects, features, and advantages of the present invention will become apparent from the following detailed description when taken in conjunction with the accompanying figure which illustrates, by way of example, the principles of the present invention.

BRIEF DESCRIPTION OF THE FIGURE

The accompanying FIGURE serves to further explain the principles of this invention. The FIGURE is a graph illustrating the results of a macro-adhesion evaluation of first and second examples of the inventive composition (designated as SPexA and SPexB, respectively) compared to conventional samples (designated as HMDS(V) and HMDS(S)) and a control sample, in which HMDS(V) is hexamethyldisilane prepared by vapor deposition and HMDS(S) is hesamethyldisilane prepared by immersion.

DETAILED DESCRIPTION OF THE INVENTION

Figure 1:
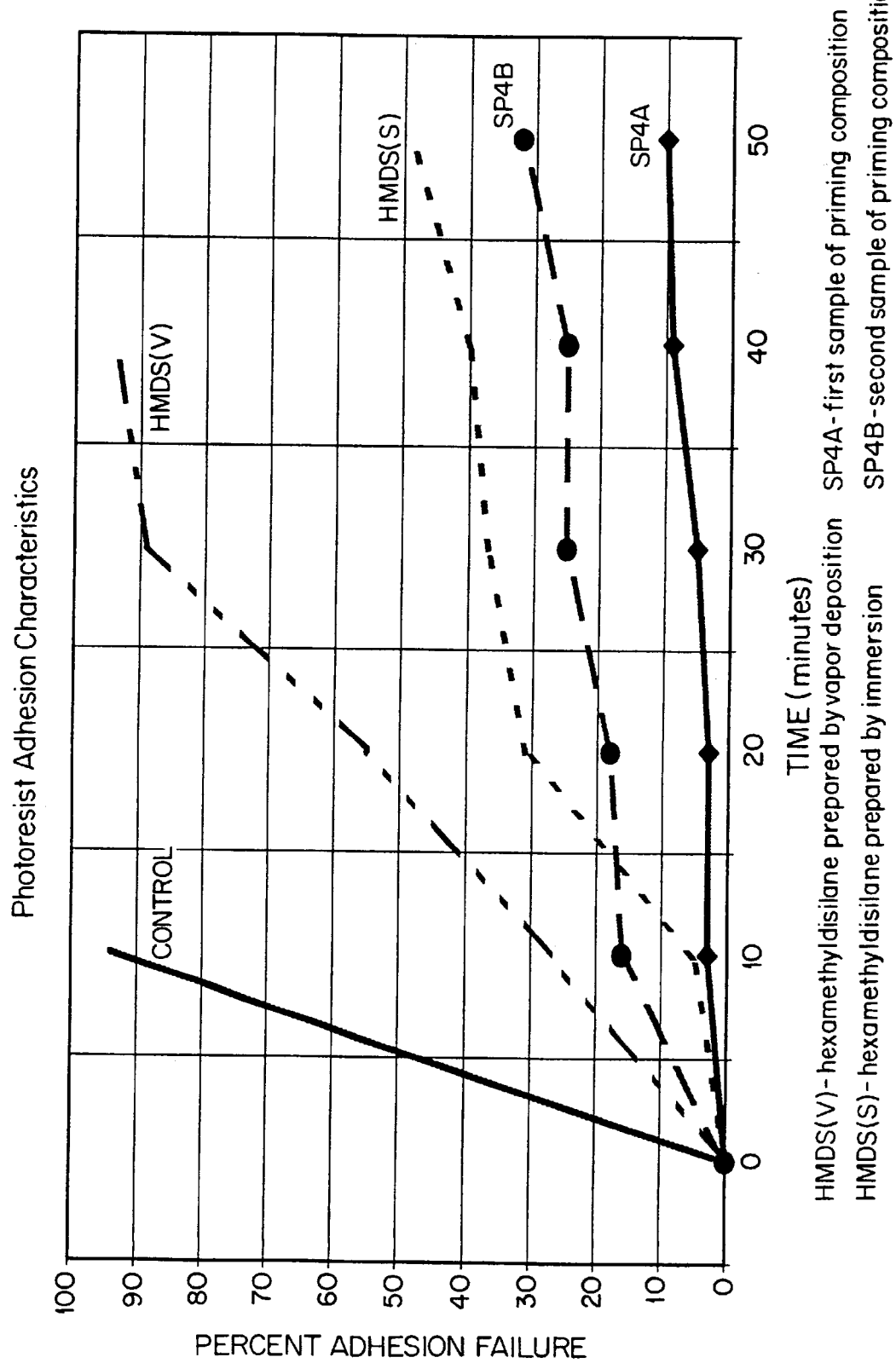

In accordance with an embodiment of this invention, the priming composition comprises at least one water-soluble polyelectrolyte having a plurality of substituents derived from cyclic ethers. The priming composition may optionally include one or more of the following, in any combination: at least one alcohol capable of increasing the stability and wetting properties of the priming composition; at least one member selected from the group consisting of alcohol ethers and ether acetates; at least one non-ionic surfactant; and at least one detergency enhancing agent.

1. The polyelectrolyte

The backbone of the polyelectrolyte may be any polymer, including a homopolymer, copolymer, or terpolymer, which provides sites onto which a cyclic ether compound may be grafted so as to be reactive with the substrate or photoresist.

For example, the backbone may be comprised of tertiary amine moieties. Representative of such a backbone is poly (ethylene imine), which may be formed from aziridine monomers. Other cyclic nitrogen containing monomers may be used in addition to or as an alternative for the aziridine monomers to prepare the backbone of the polyelectrolyte include pyrrolidine and imidazoles. The polyethylene imine backbone may be reacted or cross-linked with various substances. For example, the polyethylene imine backbone may be cross-linked with 1,2-dibromoethane, 1,8-dichloro-3,6-dioxaoctane and 1,4-dichlorobutane to provide varying degrees of adhesive retention of photoresist to the substrate. Cationic polyamines that exhibit photoresist priming functions may be created through modifying the polyamine with carboxymethylated, N-methylated, and N-phosphonomethylated derivatives.

The backbone may also contain quaternary ammonium moieties. Such backbones include, for example, polyamine homopolymers generally known as polyDADMAC's, such as polydimethyldiallylammonium chloride. These quaternary ammonium polymers are widely available commercially as flocculating and compelling agents used in waste water treatment. Two examples of quaternary ammonium products are PURIFLOC sold by Dow Chemical of Midland, Mich. and CAT-FLOC sold by Calgon of Pittsburgh, Pa. Other specialized quaternary ammonium compounds are also available from Polyscience, Inc.

Other materials such as polysulfones, in which sulfur atoms provide a charged site for grafting of cyclic ethers, may also be used as the backbone.

The polyelectrolyte may have a relatively high average molecular weight, although this is not essential. It is believed that the adhesion characteristic of the polyelectrolyte increases as the distance between the tertiary or quaternary nitrogen is reduced. This may be significant where the polymer catalyzation is the result of reacting aziridine monomers with various fatty acids such as, but not limited to, lauric, oleic, and stearic acids.

Grafted onto the backbone are one or more cyclic ethers. As referred to herein, cyclic ethers mean compounds having at least one non-aromatic ring with at least one oxygen atoms contained in the non-aromatic ring. Preferred cyclic ethers are epoxides. Representative epoxides include, without limitation, alkylene oxides, such as ethylene oxide and propylene oxide; halide-containing compounds such as epichlorohydrin and trichlorobutylene (TCBO); and glycidyl compounds such as glycidol. Cyclic ethers other than epoxides, such as tetrahydrofuran (THF), as well as cyclic ethers having rings containing two or more oxygen atoms, such as 1,4-dioxane, may also be used. As referred to herein, cyclic ether also encompasses oxygen-containing ether rings having one or more heteroatoms, such as nitrogen atoms.

Exemplary tertiary amine polyelectrolytes include hydroxyalkyl-substituted polyamines, such as hydroxyl ethylated polyethylene imine ("HEPEI"), which is polyethylene imine grafted with ethylene oxide and having the following general structure:

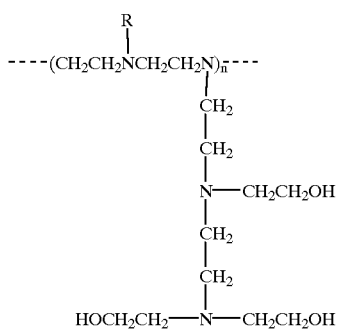

in which R may be a continuation of the polymer, a hydrogen atom (H), or a substituent derived from ethylene oxide.

HEPEI is preferred where the priming composition is used on a silicone substrate. The backbone of the HEPEI may be prepared from aziridine monomers; the grafted substituents may be prepared from epoxide monomers. HEPEI is readily available commercially from several manufacturers, including Polysciences, Inc. of Warrington, Pa. The polymer is generally available with an average molecular weight of 5000 to 100,000. While the present invention is not intended to be limited by such theory, it is not believed that the number of repeating units has a direct impact on the ability of the polyelectrolyte to promote adhesion to photoresist.

Specifically beneficial to enhancing photoresist adhesion to metallic substrates is the use of epichlorohydrin grafted onto polyethylene imine, which is also known as polyethylene imine-epichlorohydrin (PEIECH) and has the following general structure:

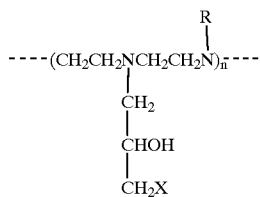

wherein X is chlorine or hydroxyl.

In one preferred embodiment, HEPEI is mixed, such as by conventional blending, with PEIECH for purposes of promoting adhesion over a broad range of substrates. While both HEPEI and PEIECH promote adhesion of photoresist to glass, HEPEI is preferred for this substrate as the chloride counter ion utilized by PEIECH has been found to cause rare instances of corrosion of the stainless steel processing equipment. Additionally, HEPEI has been found to be easier to filter to the submicron level with minimal filter loading.

Both HEPEI and PEIECH are very effective in small concentrations, making them very economical as well as minimizing the introduction of any associated contaminants into the sensitive microlithography process. The preferred embodiment of the HEPEI variation of the primer contains 0.5–1.0% by volume of the active polymer, while the variation using PEIECH is used from 0.5–5.0% by volume. Mixed polymer matrices may use a volume ratio of HEPEI to PEIECH ranging from about 1:1 to about 1:5, and a volume ratio of polyelectrolyte to water of about 1:10. Increasing the amount of HEPEI above 1.0% by volume in a single polymer embodiment or above a 1:1 volume ratio in a mixed polymer variation has been found not to increase the adhesive value of the primer.

2. Alcohols

As referred to herein, alcohol includes one or more mono-hydroxyl alcohols, polyalcohols, polymeric alcohols or other alcohol equivalents that function to charge-stabilize the priming composition. Of the above-mentioned alcohols, the priming composition preferably comprises a polyhydroxy alcohol (or polyol), more preferably dihydroxy alcohols commonly known as glycols. Typical illustrative examples of suitable glycols include ethylene glycol, propylene glycol, trimethylene glycol, tetramethylene glycol, pentamethylene glycol, and hexamethylene glycol and mixtures thereof. Suitable polyalcohols that can be used include polyvinyl alcohol (PVA) or derivatives thereof.

Lower molecular weight glycols, such as ethylene glycol and propylene glycol, are preferred because they provide reactive functional groups that provide charge-stabilizing characteristics, which increases the hydrophilicity of the substrate. While this component is not essential to the immediate function of the polyelectrolyte in promoting adhesion, it is highly desirable for promoting long-term stability of the polymer in an aqueous solution.

In situations in which propylene glycol is used as the primary solvent for thinning the photoresist, it is preferred that propylene glycol also be used as the primary charge stabilizing alcohol, since propylene glycol will exhibit improved compatibility between the hydrophilic alcohol and the often hydrophobic photoresist resins, such as cresol formaldehyde and novolak (phenol-formaldehyde). In addition, propylene glycol poses lower health and safety hazards than other acceptable alcohols. The use of propylene glycol was found most effective when the invention was made up at an initial concentration by volume of 1:1 polyelectrolyte to alcohol. Using this ratio, the polyelectrolyte, in this case HEPEI, was easily dissolved. The concentrate could then be diluted with water without the occurrence of precipitation of the polymer. Where other components are to be added to the polyelectrolyte, they will be most successfully incorporated after dilution. While making up a priming composition containing 5 vol % HEPEI and 5 vol % propylene glycol incurred precipitation or clouding of the solution, a concentrated solution containing 50 vol % HEPEI and 50 vol % propylene glycol by volume could be diluted to 10 vol % (containing 5 vol % HEPEI and 5 vol % propylene glycol) in water with no loss of stability. The balance of these concentrations may be optimized solely for maintaining solubility of the polyelectrolyte in an aqueous solution, and does not affect the immediate functionality of the adhesion promoter itself.

3. Alcohol Ether

As referred to herein, alcohol ethers include one or more alcohol ethers, especially an alkyl ether of a hydroxy alcohol, such as ethylene glycol and alcohol derivatives of glycol monomethyl ether acetate.

Currently preferred are alkyl ethers known as carbitols. Of these, propylene glycol derivatives, especially propylene glycol monomethyl ether or its ether acetate are preferred. The propylene glycol derivatives are generally preferred over the ethylene glycol derivatives as they do not demonstrate the adverse health and reproductive effects of ethylene glycol ethers. Like the use of propylene glycol described above, propylene glycol monomethyl ether is also preferred as it is commonly used as a solvent in photoresist. Diethylene glycol monomethyl ether has also been shown to provide excellent charge stabilizing characteristics for both HEPEI and PEIECH based and mixed photoresist adhesion promoters.

It is also within the scope of the invention to use monoalkyl ethers of monoethylene glycol (monoalkyl cellosolves) as illustrated by monomethyl ether of ethylene glycol, monoethyl ether of ethylene glycol and n-butyl ether of ethylene glycol and mixtures thereof as well as mixtures thereof with the alkyl ethers of diethylene glycol.

Polyethylene glycols (PEGs) of the formula $HOCH_2CH_2(OCH_2CH_2)_n OH$ where n ranges from 200–50,000 can also be used.

Additionally, crown ethers including ethyl, n-butyl ethers, or other compounds may be used where the compound has similar solvating characteristics suitable for satisfying the dielectric constant, pKa of the removable protons, etc. of the polyelectrolyte. The charge stabilizing characteristics may be satisfied through the addition of a suitable counter-ion, such as chloride. Counter-ions may be added in the form of a salt or other compound in which the anion is readily dispersed in water to stabilize the charge of the cationic amine.

Although the presence of an ether does not adversely affect the adhesion capabilities of the primer, the charge stabilizing characteristics they provide significantly enhance the solubility of polyamine, preventing precipitation or flocculation which may be commercially undesirable.

4. Wetting Agent

While the incorporation of a wetting agent or compound capable of acting as a wetting agent is not essential to the function of the bonding properties of the polyelectrolyte, it may be desirable to add such a surface agent where the primer is used on extremely hydrophobic substrates, or where the adhesion promoter is designed to work as both a cleaning agent and a primer.

Ideally, the wetting agent used is a nonionic surfactant that will not cross-link or otherwise interfere with the surface charge of the polyelectrolyte. Higher molecular weight polymeric surfactants may be more efficient at providing film coverage and substrate absorption than lower molecular weight monomeric wetters. A mixture of alkylaryl polyether and octylphenoxypolyethoxy ethanol, sold under the trade name TRITON CF-10, provides excellent wetting of hydrophobic surfaces, yet is very low foaming thus allowing a broader range of application methods, including ultrasonic agitation or washing. Where greater foaming or wetting is desired, polyethylene glycol mono [4-(1,1,3,3-tetramethylbutyl)phenyl] ether is preferred. The latter is available under the trade name TRITON X-100. Both TRITON CF-10 and TRITON X-100 an be effective at relatively low concentrations of 1% by volume or less.

It is also possible to use any of a number of polymeric wetting gents such as polyethylene glycol (PEG), polyvinyl alcohol (PVA) polyvinylpyrrolidone (PVP), hydroxypropylcellulose (HPC) or any other polymer or copolymer with reactive hydroxyl sites. It should be noted that any component capable of enhancing the hydrophilicity of the substrate may be suitable.

5. Detergency Enhancing Agents

Detergency enhancing agents may be added to enhance the cleaning action of the primer. The addition of this agent facilitates the elimination of separate wet chemical cleaning and priming stages. Salt additives, such as sodium sulfate, sodium chloride, ammonium chloride, and/or ammonium bifluoride may be used. It should be noted that such additives may also serve the function of charge stabilizing the polyelectrolyte in solution.

6. Other Components

It is possible, but not essential, to add organic acids or bases in order to obtain a pH level optimum for the performance of the polyelectrolyte. Preferably, acetic acid is added after dilution of the polyelectrolyte matrix to achieve an optimum pH of 4.0–7.0. While the specified organic acid is not believed to be critical other than in its ability to satisfy the pH modifying requirements, certain organic acids, such as citric acid, are avoided where the known substrate material is a metal normally chelated by the acid. Any strong oxidizer would also be avoided due to its degrading effect on the active polyelectrolyte.

The substrate can be precleaned before application of the present priming composition, if desired, but it is not necessary. Suitable precleaning techniques and agents are known to those skilled in the art, and include ion and plasma etching of the substrate and washing of the substrate with chlorinated and non-chlorinated organic solvents.

The priming composition of the invention whether used as a concentrate or in diluted form can be applied to a stationary or moving substrate to be coated with a photoresist in any known manner, for example, by spraying, brushing, immersing, or other known means.

For example, the priming composition can be applied to a substrate by spin coating. The priming composition is applied by spraying, for example, to a rotating substrate, optionally followed by rinsing the rotating substrate with water or other suitable diluent to remove contaminants and excess priming composition from the surface of the substrate. The substrate is dried by spinning the substrate and then a coat of photoresist is applied to a priming composition-coated side of the substrate.

The priming composition can also be applied to a substrate by brush cleaning. According to this procedure, a side of a rotating or stationary substrate is cleaned by brushing and scrubbing the substrate in the presence of the inventive priming composition, followed by rinsing the brushed and scrubbed substrate with water or other diluent, drying, and then applying a coating of photoresist to the brushed and scrubbed substrate.

The priming composition can also be applied to a substrate prior to coating the substrate with a photoresist by immersion in a vessel containing the priming composition. If desired, the priming composition can be agitated by mechanical, ultrasonic or megasonic (degas) or other suitable means during immersion of the substrate into the priming composition. After immersion, the substrate is rinsed with water or other diluent, dried and then the dried substrate is coated with a layer of photoresist.

The temperature obtained during applying the priming composition to the substrate is usually ambient although higher or lower temperatures, e.g., 20–55° C., can be used.

The amount of priming composition applied to a substrate is sufficient to provide a thin layer of the priming composition on a side of a substrate to be coated with photoresist.

In accordance with a variation of this invention, the priming composition may be dissolved into a charge-solvating solution which is compatible with the photoresist to create a self-priming photoresist. In this variant embodiment, the cyclic ether substituent of the polyelectrolyte bonds with the photoresist resin prior to application to the substrate.

Substrates that can be used according to the invention include silicon, glass, indium tin oxide (ITO), gallium arsenate (GaAs), nickel, or other suitable substrates that provide a base for positive and negative photoresists. Where metal substrates are used, it is believed that oxygen-metallic bonds formed between the substrate and the oxygen atoms of the cyclic ether ring.

A positive or negative photoresist can be applied to a substrate having a layer of the inventive priming composition in any manner known in the art and then subjected to photochemical treatment to cure and bond the photoresist to the substrate.

Photoresists used in optical media mastering generally comprise photo-active compounds combined in a resin media. This resin media typically includes as constituents alkali-soluble terpene phenols reacted with an aldehyde and/or ketone in the presence of an acidic catalyst. The aldehyde is typically formaldehyde, p-formaldehyde, acetaldehyde, propylaldehyde, benzaldehyde, phenyl-acetaldehyde or furfural. The ketone is usually acetone or cyclohexanone. The final resist is applied to a substrate in a solvent media of ethylene glycol or propylene glycol, with propylene glycol monomethyl ether acetate preferred for its toxicological advantages.

The dominant photoresist in the compact disc industry is a product called Shipley 1800 series where the last two digits refer to the coating thickness in microns when applied by spin coating at 4000 rpm. Actual coating thickness appears to be irrelevant in relationship to the present invention as bonding is only required at the matrix interface in order to obtain the desire priming results. The Shipley 1800 series resist is comprised of the photo-active compounds and a cresol formaldehyde resin in a propylene glycol solvent.

Primers currently used with the above-described photoresists consist almost exclusively of silane ($SiH_4$) compounds. Of these, the predominant primer is hexamethyldisilane (HMDS), though other silanes including amino silanes are also used. This compound is believed to form a bridge bond between the photoresist and the substrate, cross-linking, to provide adhesion. HMDS is used either as a concentrate or diluted, though dilution is not recommended due to inconsistency in coating thickness. If diluted, the same solvent used in the resist is added to the silane.

Silanes are deposited either by vapor deposition in which a substrate is placed in a chamber where the silane is vaporized, or through spin coat application where the silane is dispensed onto a rotating substrate until coated, then spun dry.

A significant difference between the present invention and HMDS is tolerance to water. The presence of moisture between the substrate and the HMDS may result in adhesion failure. This problem is often addressed by baking the substrate for dehydration prior to application of the HMDS primer. It should be noted that there exist solvated silane primers which may be diluted with water. Unlike the subject primers, these primers are highly volatile and have a short shelf life.

As discussed above, the instant priming composition is a complete cleaning and adhesion promoting composition for use with photoresists on various substrates. The priming composition of the invention accomplishes the tasks of acting as an anti-static agent so that charged contaminants, such as dust particles, may be easily removed by rinsing and bond promoting through providing covalent bond sites for the adhesion of the substrate and subsequently applied photo-resist. The invention priming composition provides a number of advantages and the first real alternative to HMDS, silanes, titanates, and organic salt adhesive promoters.

The present invention provides several advantages over the compositions now employed in the art. For example, because cleaning and adhesion are performed within a single step, processing time is faster and associated cost savings may be realized by the elimination of multi-step processes. Also, the inventive composition reduces delamination and under cutting in HF etch, and, in the case of priming optical storage media, reduces or eliminates micro-adhesion failures and associated jitter, block error rate, and replication release patterns. Additionally, the inventive priming composition substantially eliminates the use of hazardous volatile solvents, thereby making waste treatment much easier and inexpensive and extending shelf life. As noted above, the need for dehydration baking steps is largely reduced by the use of the inventive priming composition.

EXAMPLES

In the following examples, macro-adhesion describes the ability of the priming agent to reduce failure by environmental factors such as handling, temperature fluctuations, thermodynamics, compressive stress of the photoresist.

Micro-adhesion describes the ability of the priming agent to reduce delamination and undercutting of the photoresist at the matrix interface, as may occur during exposure to developing or etching solutions during processing.

Experiments and Evaluation

Evaluations were carried out comparing the photoresist adhesion for an example of the inventive priming composition, HMDS (hexamethyldisilane) and a control group. The compositions were evaluated for the ability of each to provide both macro- and micro-adhesion of cresol formaldehyde to glass substrates.

A. Macro-Adhesion Evaluation:

Macro-adhesion was evaluated through visual examination of glass slides which were primed, coated with photoresist and exposed to ultrasonic agitation.

Study Test Groups:
1. A first sample of the inventive priming composition SPexA comprised 1% by volume ethoxylated polyethylenimine (HEPEI), 7.5 mL/L propylene glycol monomethyl ether, and 2.5 mL/L propylene glycol. The pH was modified to 7.0 using acetic acid, and was filtered to 0.2 microns. Glass slides were primed by immersion in the priming agent, followed immediately by spin drying at 500 rpm for three minutes.
2. A second sample of the inventive priming composition SPexB comprised 5% by volume epichlorohydrin cross linked with polyethylenimine (PEIECH), 7.5 mL/L propylene glycol monomethyl ether, and 2.5 mL/L propylene glycol. The pH was modified to 7.0 using acetic acid, and was filtered to 0.2 microns. Glass slides were primed by immersion in the priming agent, followed immediately by spin drying at 500 rpm for three minutes.
3. A first comparative sample (HMDS(V)) was prepared by vapor deposition of glass slides in HMDS (hexamethyldisilane) under a seal hood for 30 minutes.
4. A second comparative sample (HMDS(S)) was prepared by immersion of glass slides in 100% HMDS (hexamethyldisilane), followed by filtering to 0.2 microns for 30 seconds, then immediately thereafter spin drying at 500 rpm for three minutes.
5. Control: As a control sample, a glass slide was treated with deionized water, then filtered to 0.2 microns.

Process Parameters:
1. Corning pre-cleaned microscope slides were masked on one side for single surface coating of immersion processing, using sulfur-free vinyl tape.
2. Slide primed as described in "Study Test Groups".
3. Primed slides were coated in cresol formaldehyde type photoresist (Shipley Microposit 1805) by immersion for 15 seconds. Slides were spun dry at 500 rpm, 5 minutes, immediately after coating to provide uniform coating thickness.

4. Vinyl masking was removed and the slides were baked in a convection oven at 110° C. for 30 minutes.

5. Test groups were evaluated at five minute intervals for presence of photoresist after exposure to ultrasonic agitation, using DI water maintained at 50° C. This temperature was selected as this is the typical operating temperature of a sulfamate nickel electroforming bath which would be used for creating nickel compact disc master from recorded photoresist. Slides were tested one at a time with placement in identical positions to reduce variability of ultrasonic field exposure.

6. To reduce variability, batch processing was used in all spin dry and baking operations.

Evaluation of Macro-Adhesion:

Test slides were evaluated after each 5 minute interval of exposure to ultrasonic agitation. Presence of photoresist was evaluated by placing the slide against a template divided into 5×13–4 millimeter cells and observing under ultraviolet light. Cells showing significant loss of adhesion, or absence of greater than 20% of the photoresist, were counted as a failure of that cell. The template configuration disregarded any failure within 4 mm of the edge of the slide as edge failure may be the result of delamination and undercutting.

The results are shown in graphical form in the FIGURE as percent failure by time interval for each test group. The inventive primers showed a significant reduction in adhesion failure over both the control group and HMDS.

The foregoing detailed description of the invention has been provided for the purposes of illustration and description. It is not intended to be exhaustive or to limit the invention to the precise embodiments disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

I claim:

1. A method of bonding a photoresist to a substrate with an aqueous priming composition, said method comprising:

applying to at least one surface of the substrate an effective amount of an aqueous priming composition to form a film on the surface of the substrate, the aqueous priming composition comprising at least one water-soluble polyelectrolyte having a plurality of hydroxy-functional substituents derived from cyclic ethers, a portion of the hydroxyl-functional substituents of the water-soluble polyelectrolyte functioning to bond the priming composition to the substrate; and applying a photoresist composition to the film and reacting the photoresist composition with residual ones of the hydroxy-functional substituents which have not bonded with the substrate.

2. A method according to claim 1, further comprising subjecting the photoresist composition to photochemical treatment to form the photoresist.

3. A method according to claim 1, further comprising neutralizing electrostatic charges of contaminants with the polyelectrolyte and rinsing the substrate with water to remove the neutralized contaminants and excess portions of the film not having bonded to the substrate, said rinsing being conducted after the aqueous priming composition has been applied to the substrate but before the photoresist composition has been applied to the film.

4. A method according to claim 1, wherein the polyelectrolyte has a backbone comprising quaternary ammonium moieties.

5. A method according to claim 1, wherein the polyelectrolyte comprises a backbone derived from polyethylene imine.

6. A method according to claim 5, wherein the polyelectrolyte is derived by grafting an epoxide onto the pholyethylene imine backbone.

7. A method according to claim 1, wherein the polyelectrolyte comprises hydroxyethylated polyethylene imine.

8. A method according to claim 1, wherein the polyelectrolyte comprises polyethylene imine epichlorohydrin.

9. A method according to claim 1, wherein the polyelectrolyte has a backbone derived from polydimethyldiallylammonium chloride.

10. A method according to claim 1, wherein said composition is in a diluted state and comprises 0.5–5.0 vol % of the polyelectrolyte.

11. A method according to claim 1, wherein the priming composition further comprises at least one member selected from the group consisting of alcohols, alcohol ethers, nonionic surfactants, and detergency enhancing agents.

12. A method of applying a photoresist to a substrate, comprising applying an aqueous priming composition and a photoresist composition to a substrate, the aqueous priming composition comprising at least one water-soluble polyelectrolyte having a plurality of hydroxy-functional substituents derived from cyclic ethers.

13. A method according to claim 12, further comprising curing the photoresist composition to form a photoresist on the substrate.

14. A method according to claim 12, wherein the polyelectrolyte has a backbone comprising tertiary amine moieties.

15. A method according to claim 12, wherein the polyelectrolyte has a backbone comprising quaternary ammonium moieties.

16. A method according to claim 12, wherein the cyclic ethers comprise one or more epoxides.

17. A method according to claim 12, wherein the cyclic ethers comprise one or more alkylene oxides.

18. A method according to claim 17, wherein the alkylene oxide comprises ethylene oxide.

19. A method according to claim 12, wherein the polyelectrolyte comprises a backbone derived from polyethylene imine.

20. A method according to claim 12, wherein the polyelectrolyte is derived by grafting an epoxide onto the pholyethylene imine backbone.

21. A method according to claim 12, wherein the polyelectrolyte comprises hydroxyethylated polyethylene imine.

22. A method according to claim 12, wherein the substituents comprise one or more hydroxyalkylene halide substituents.

23. A method according to claim 22, wherein the polyelectrolyte comprises polyethylene imine epichlorohydrin.

24. A method according to claim 12, wherein the polyelectrolyte comprises a blend of hydroxyethylated polyethylene imine and polyethylene imine epichlorohydrin.

25. A method according to claim 12, wherein the polyelectrolyte has a backbone derived from polydimethyldiallylammonium chloride.

26. A method according to claim 12, wherein the priming composition further comprises at least one member selected from the group consisting of alcohols, alcohol ethers, non-ionic surfactants, and detergency enhancing agents.

27. A method according to claim 12, wherein the priming composition comprises 0.5–5.0 vol % of the polyelectrolyte.

28. A method according to claim 12, further comprising neutralizing electrostatic charges of contaminants with the polyelectrolyte and rinsing the substrate with water to remove the neutralized contaminants and excess portions of the film not having bonded to the substrate, said rinsing being conducted after the aqueous priming composition has been applied to the substrate but before the photoresist composition has been applied.

29. A method according to claim 12, further comprising combining the aqueous priming composition and the photoresist to prepare a self-priming photoresist composition, and applying the self-priming photoresist composition to the substrate.

30. A method according to claim 29, further comprising subjecting the self-priming photoresist composition to photochemical treatment to form a photoresist on the substrate.

* * * * *